United States Patent [19]

Kitamura et al.

[11] Patent Number: 4,925,641

[45] Date of Patent: May 15, 1990

[54] PROCESS FOR PREPARING ALUMINUM BORATE WHISKERS

[75] Inventors: Takao Kitamura; Kohji Sakane; Hideo Wada, all of Takamatsu; Hajime Hata; Hajime Kanbara, both of Marugame, all of Japan

[73] Assignees: Agency of Industrial Science & Technology, Tokyo; Shikoku Chemicals Corporation, Kagawa, both of Japan

[21] Appl. No.: 207,538

[22] Filed: Jun. 16, 1988

[30] Foreign Application Priority Data

Jun. 20, 1987 [JP] Japan ................................ 62-152418
Jun. 20, 1987 [JP] Japan ................................ 62-152419

[51] Int. Cl.$^5$ ............................................. C01B 35/12
[52] U.S. Cl. ..................................... 423/279; 423/625
[58] Field of Search ................... 423/279, 277, 625; 501/95, 127

[56] References Cited

U.S. PATENT DOCUMENTS

| | | | |
|---|---|---|---|
| 2,118,143 | 4/1935 | Benner et al. | 423/279 |
| 3,080,242 | 3/1963 | Berry | 423/277 |
| 3,350,166 | 10/1967 | Alley et al. | 423/279 |
| 3,384,578 | 5/1968 | Stuber | 423/279 |
| 4,226,629 | 10/1980 | Tabuchi et al. | 423/279 |

FOREIGN PATENT DOCUMENTS 497231  5/1976  U.S.S.R. .............................. 423/279

OTHER PUBLICATIONS

Johnson et al., "Synthesis and Some Properties of Aluminum Borate Whiskers", p. 2, 1965 (United States Department of the Interior Bureau of Mines).

*Primary Examiner*—Jack Cooper
*Attorney, Agent, or Firm*—Sherman and Shalloway

[57] ABSTRACT

An aluminum borate whisker having a composition of $9Al_2O_3 \cdot 2B_2O_3$ or $2Al_2O_3 \cdot B_2O_3$ is formed by reacting under heating at least one aluminum-supplying component selected from the group consisting of hydroxides and inorganic salts of aluminum and at least one boric acid-supplying component selected from the group consisting of oxides, oxyacids and their alkali metal salts of boron in the presence of at least one flux selected from the group consisting of alkali metal chlorides, alkali metal sulfates and alkali carbonates.

5 Claims, 1 Drawing Sheet

PROCESS FOR PREPARING ALUMINUM BORATE WHISKERS

BACKGROUND OF THE INVENTION

(1) Field of the Invention

The present invention relates to aluminum borate whiskers and a process for the preparation thereof.

The whisker of the present invention is excellent in chemical resistance, heat resistance, neutron-absorbing capacity and electrical insulating property and is valuable as a heat-insulating material, a heat-resistant material and a corrosion-resistant material and also as a reinforcer for thermoplastic resins, thermosetting resins, cements, ceramics and metals.

(2) Description of the Prior Art

Recently, ceramic whiskers having excellent thermal and mechanical properties have been manufactured on an industrial scale and investigations have been made on these ceramic whiskers. The ceramic whiskers are roughly divided into non-oxide and oxide types. SiC, $Si_3N_4$ and the like belong to the former type, and $CaSO_4$, $K_2O.6TiO_2$ (Japanese Patent Publication No. 25157/80) and $2MgO.B_2O_3$ (Japanese Patent Application Laid-Open Specification No. 204697/85) belong to the latter type.

Non-oxide type whiskers generally have a high melting point (higher than 1900° C.) and have an excellent heat resistance, but since the atmosphere should be adjusted at the production step, the equipment and material costs are increased and uses of obtained whiskers are limited.

In contrast, the melting points of oxide type whiskers are not so high (1000° to 1600° C.) as those of non-oxide type whiskers and the heat resistance is inferior, but since oxide type whiskers can be prepared in the open air by the liquid phase method using a flux, the equipment and material costs are low. Accordingly, oxide type whiskers can be used in the general-purpose fields where a high heat resistance is not required, for example, as a reinforcer for plastics and as a reinforcer for aluminum.

The phase diagram of a boric acid salt of aluminum generally called aluminum borate has already been completed [P. J. M. Gielisse, Nature, 4836, 69–70 (1962)], and the presence of $9Al_2O_3.2B_2O_3$ and $2Al_2O_3.B_2O_3$ as compounds have been clarified. However, whiskers of these compounds have not been provided. Although synthesis of whiskers of these compounds was tried several times in the past, all of the obtained whiskers had a composition of aluminum and boron not shown in the phase diagram.

For example, from the specification of U.S. Pat. No. 3,080,242, it is known that whiskers having compositions of $3Al_2O_3.B_2O_3$ and $9Al_2O_3.B_2O_3$ are obtained by heating aluminum hydroxide and boron oxide and gradually cooling the heated mixture. From the report published by Bureau of Mines, the Department of the Interior, U.S.A., it is known that whiskers having a composition of $2.5Al_2O_3.B_2O_3$ are obtained by heating aluminum oxide, sodium tetraborate and lithium chloride at 1200° C. and whiskers having a composition of $4.8Al_2O_3.B_2O_3$ are obtained by heating aluminum oxide, sodium tetraborate and boron oxide [R. C. Johnson, "Bureau of Mines Report of Investigations, 6675" (1965)].

Furthermore, with respect to whiskers of the latter type, the specification of U.S. Pat. No. 3,350,166 teaches that whiskers having a composition of $4Al_2O_3.B_2O_3$ are obtained by the gas phase reaction process comprising passing steam through aluminum fluoride and boron oxide in the gaseous state at 1000° to 1400° C.

Oxide type whiskers such as $CaSO_4$, $K_2O.6TiO_2$ and $2MgO.B_2O_3$ can be prepared at low costs by the liquid phase process and expansion of uses is expected, but they are defective in that the chemical resistance, especially the acid resistance, is inferior and when they are used as reinforcers, it is apprehended that a problem will arise in connection with the long-period reliability.

Aluminum borate whiskers have already been synthesized, as pointed out hereinbefore, and molecular formulae of these whiskers are $3Al_2O_3.B_2O_3$, $2.5Al_2O_3.B_2O_3$, $4Al_2O_3.B_2O_3$, $4.8Al_2O_3.B_2O_3$ and $9Al_2O_3.B_2O_3$, but whiskers of aluminum borate having a composition of $9Al_2O_3.2B_2O_3$, or $2Al_2O_3.B_2O_3$ have not been synthesized.

The whisker is a needle-shaped single crystal having a high aspect ratio, which has no grain boundary and a smaller number of defects than a polycrystal, and therefore, the whisker is characterized in that the mechanical strength is very high. However, if the size is increased, the number of defects is increased and in some cases, a polycrystal comprising single crystals aggregating along the fiber axis is formed and the strength is drastically reduced, with the result that the significance of use of the whisker is lost. More specifically, it was reported that a whisker having a fiber diameter of about 1 $\mu m$ has a tensile strength of 5000 MPa but if the fiber diameter is increased to 5 $\mu m$, the strength is reduced to 700 MPa. The above-mentioned aluminum borate whiskers synthesized in the past have a fiber diameter of about 5 to about 100 $\mu m$, which is included in the region where the mechanical strength is drastically reduced, and when the whisker is used as a reinforcer, a whisker having a fiber diameter of about 1 $\mu m$ is desirable.

SUMMARY OF THE INVENTION

It is therefore a primary object of the present invention to provide aluminum borate whiskers having excellent chemical resistance, heat insulating property, heat resistance, neutron-absorbing capacity and electrical insulating property and having a fine fiber diameter and a high strength, and a process for the preparation thereof.

Under the above-mentioned background, we made investigations and as the result, it was found that the above-mentioned object can be obtained by reacting an aluminum-supplying source selected from the group consisting of hydroxides and inorganic salts of aluminum with a predetermined boric acid-supplying source and a flux at a predetermined temperature.

In accordance with the present invention, there is provided a process for the preparation of an aluminum borate whisker, which comprises heating at least one aluminum-supplying component selected from the group consisting of hydroxides and inorganic salts of aluminum and at least one boric acid-supplying component selected from the group consisting of oxides, oxyacids and their alkali metal salts of boron in the presence of at least one flux selected from the group consisting of alkali metal chlorides, alkali metal sulfates and alkali metal carbonates to effect reaction and growing.

Furthermore, in accordance with the present invention, there is provided an aluminum borate whisker having a composition represented by a chemical formula of $9Al_2O_3 \cdot 2B_2O_3(Al_{18}B_4O_{33})$ or $2Al_2O_3 \cdot B_2O_3$ ($Al_4B_2O_9$).

DETAILED DESCRIPTION OF THE PREFERRED EMBODIMENTS

Each of aluminum borates having compositions of $9Al_2O_3 \cdot 2B_2O_3$ and $2Al_2O_3 \cdot B_2O_3$ according to the present invention is prominently characterized in that the whisker is composed of a needle-shaped single crystal. Aluminum borates having compositions of $9Al_2O_3 \cdot 2B_2O_3$ and $2Al_2O_3 \cdot B_2O_3$ are excellent in the chemical resistance and the whisker of the present invention retains this characteristic.

Figure 1:
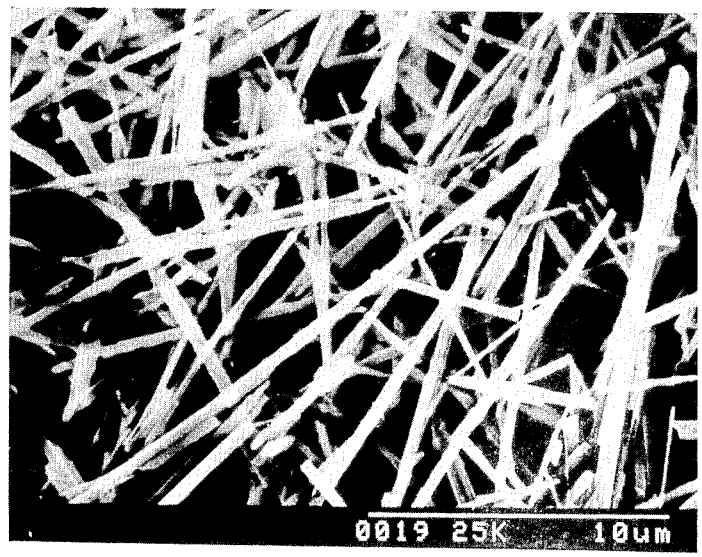
FIG. 1 is a scanning electron microscope photograph showing the fiber structure of the aluminum borate ($9Al_2O_3 \cdot 2B_2O_3$) whisker obtained in Example 1 of the present invention.

The aluminum borate whisker having a composition represented by the formula of $9Al_2O_3 \cdot 2B_2O_3$ has X-ray diffraction data shown in Table 1 and a fibrous shape shown in an electron microscope photograph of FIG. 1.

Figure 2:
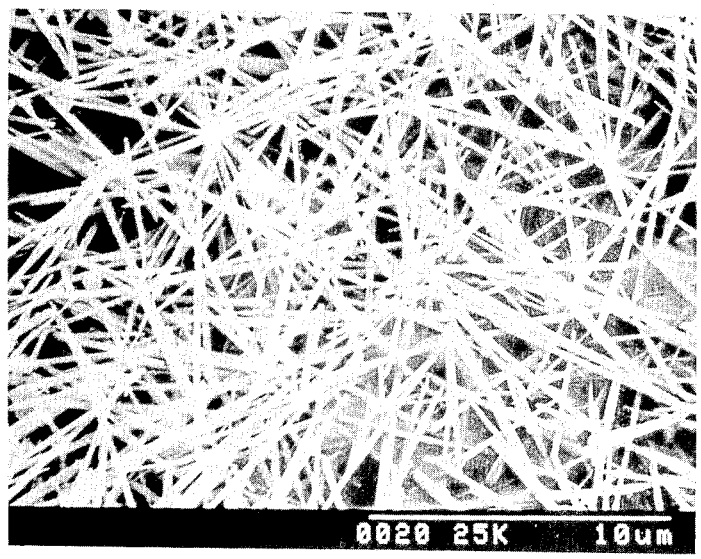
FIG. 2 is a scanning electron microscope photograph showing the fiber structure of the aluminum borate ($2Al_2O_3 \cdot B_2O_3$) whisker obtained in Example 8 of the present invention.

The aluminum borate whisker having a composition represented by the formula of $2Al_2O_3 \cdot B_2O_3$ has X-ray diffraction data shown in Table 2 and a fibrous shape shown in an electron microscope photograph of FIG. 2.

From the X-ray diffraction data and electron microscope photographs, it will readily be understood that each of whiskers of $9Al_2O_3 \cdot 2B_2O_3$ and $2Al_2O_3 \cdot B_2O_3$ is composed of a single phase, the crystal structure grows very promptly in the direction of the C axis (the direction of the fiber axis), the fiber diameter is extremely fine and uniform, and a fiber structure desirable for the strength is realized.

From the viewpoint of various physical properties, an aluminum borate whisker represented by the formula of $9Al_2O_3 \cdot 2B_2O_3$ is preferred.

The aluminum borate whisker of the present invention can be obtained by reacting an aluminum-supplying component with a boric acid-supplying component in the presence of a flux, and one of the characteristic features of this process is that a hydroxide or inorganic salt of aluminum is used as the aluminum-supplying component. This specific component is converted to active aluminum oxide during reaction and growth, and because of a high reactivity of this aluminum oxide, the problem of the existence of residual unreacted alumina does not arise and the effect of reducing the diameter of the formed whisker is attained.

Another characteristic features is that reaction is carried out at a relatively low temperature in the presence of a flux, especially a flux having a low viscosity. It is deemed that by this feature, isolation and decomposition of the $B_2O_3$ component in the formed whisker can be prevented, and a whisker having a single composition of $9Al_2O_3 \cdot 2B_2O_3$ or $2Al_2O_3 \cdot B_2O_3$ is formed.

As the aluminum-supplying component used in the present invention, there can be mentioned hydroxides of aluminum such as aluminum hydroxide, sulfates of aluminum such as aluminum sulfate, aluminum sulfate tetradeca- to octadeca-hydrates, potassium aluminum sulfate, sodium aluminum sulfate, sodium aluminum sulfate dodecahydrate, ammonium aluminum sulfate and ammonium aluminum sulfate dodecahydrate, nitrates of aluminum such as aluminum nitrate and aluminum nitrate nonahydrate, and chlorides of aluminum such as aluminum chloride and aluminum chloride hexahydrate. Furthermore, oxyhydroxides of aluminum such as boehmite, diaspore and toddite can be used. These aluminum-supplying components may be used singly or in the form of a mixture of two or more of them. All of these aluminum-supplying components are decomposed by heating in the open air to generate active aluminum oxide. Since the reactivity of the aluminum oxide is very high, the problem of the existence of the residual unreacted $\alpha$-alumina, observed when $\alpha$-alumina is used as the aluminum-supplying component, does not arise and the grown aluminum borate whisker is very fine.

As the boric acid-supplying component used in the present invention, there can be mentioned oxides of boron such as boron oxide, oxyacids of boron such as orthoboric acid ($H_3BO_3$), tetraboric acid ($H_2B_4O_7$) and metaboric acid ($HBO_2$), and alkali metal salts of these boron oxyacids such as potassium tetraborate, sodium tetraborate, sodium pyroborate, potassium pyroborate and sodium metaborate. These boric acid-supplying components can be used singly or in the form of a mixture of two or more of them.

A flux which melts at a relatively low temperature, that is, at a reaction temperature described hereinafter, is used. For example, there can be mentioned alkali metal chlorides such as sodium chloride and potassium chloride, alkali metal sulfates such as sodium sulfate and potassium sulfate, and alkali metal carbonates such as sodium carbonate and potassium carbonate. These fluxes may be used singly or in the form of a mixture of two or more of them.

According to the process of the present invention, the aluminum-supplying component and the boric acid-supplying component are mixed so that the aluminum/boron molar ratio is from 1/4 to 9/1, preferably from 5/5 to 8/2, and the flux is added in an amount of 10 to 95% by weight, preferably 30 to 80% by weight, based on the total mixture. If the reaction is carried out at a temperature of 900° to 1200° C. for 30 minutes to 8 hours, an aluminum borate whisker having a composition of $9Al_2O_3 \cdot 2B_2O_3$ is obtained. If the heating temperature is lower than 900° C., an aluminum borate having a composition of $2Al_2O_3 \cdot B_2O_3$ is preferentially formed and the starting substances are left unreacted, and therefore, a whisker of a single phase of $9Al_2O_3 \cdot 2B_2O_3$ cannot be obtained. If the heating temperature is higher than 1200° C., the decomposing reaction of gradually isolating the $B_2O_3$ component in the formed whisker of $9Al_2O_3 \cdot 2B_2O_3$ takes place in the presence of the flux to form $\alpha$-alumina, and no good results can be obtained. In case of the above-mentioned aluminum borates of $4.8Al_2O_3 \cdot B_2O_3$ and $9Al_2O_3 \cdot B_2O_3$, the synthesis of which has already been reported, the reaction temperature is maintained at a high level of 1400° C. so as to reduce the viscosity of the melt and increase the whisker-growing speed, and therefore, it is considered that this demposing reaction takes place. In the present invention, in order to prevent occurrence of this phenomenon, the flux having a low melt viscosity is used and the reaction temperature is controlled to 1200° C. or lower.

According to the process of the present invention, the above-mentioned aluminum-supplying component and boric acid-supplying component are mixed at an aluminum/boron molar ratio of from 1/9 to 6/4, preferably from 3/7 to 5/5, and the flux is added in an amount of 10 to 95% by weight, preferably from 30 to 80% by weight, based on the total mixture. If the reaction is carried out at a temperature of 600° to 1000° C. for 30 minutes to 8 hours, an aluminum borate having a composition of $2Al_2O_3.B_2O_3$ is obtained. If the heating temperature is lower than 600° C., the reaction is insufficient, and if the heating temperature is higher than 1000° C., the decomposing reaction of gradually isolating the $B_2O_3$ component in the formed whisker of $2Al_2O_3.B_2O_3$ takes place in the presence of the flux and $9Al_2O_3.2B_2O_3$ is mingled in the formed whisker. In case of the above-mentioned aluminum borates of $3Al_2O_3.B_2O_3$ and $2.5Al_2O_3.B_2O_3$, the synthesis of which has already been reported, in order to reduce the viscosity of the melt and increase the whisker-growing speed, the reaction temperature is maintained at a high level of 1200° to 1400° C. and therefore, it is considered that this decomposing reaction takes place. In the present invention, in order to prevent occurrence of this phenomenon, the flux having a low melt viscosity is used and the reaction temperature is controlled to 1000° C. or lower.

For isolation of the whisker from the reaction product, the reaction product is treated with hot water or hot hydrochloric acid, hot sulfuric acid or hot nitric acid having a concentration of about 1N to remove the flux and other water-soluble components. The inorganic acid is used for increasing the dissolution speed, and the treatment time is shortened to 1/10 to 1/20 of the treatment required in case of hot water. In the case where there is present a water-insoluble by-product according to the starting composition, the fibrous product is separated from the residue by such means as decantation, elutriation or bubble separation. Then, the so-obtained crude aluminum borate whisker is sufficiently washed with water to remove impurities, whereby a pure aluminum borate whisker can be obtained.

In the powder X-ray diffraction, the aluminum borate whisker having a composition of $9Al_2O_3.2B_2O_3$ has higher diffraction intensities of [120] plane of a valued of 5.375 Å, [140] and [131] planes of a value d of 3.373 Å and [240] and [231] planes of a valued d of 2.685 Å and lower intensities of [002] plane of a value d of 2.831 Å and [122] plane of a value d of 2.505 Å than those of ASTM powder X-ray diffraction card 32-3, and all the diffraction peaks are attributed to the crystal structure of $9Al_2O_3.2B_2O_3$.

Moreover, in the powder X-ray diffraction, the aluminum borate having a composition of $2Al_2O_3.B_2O_3$ has higher diffraction intensities of [220] plane of a value d of 5.30 Å, [231] plane of a value d of 3.34 Å and [440] and [341] planes of a value d of 2.650 Å than those of ASTM powder X-ray diffraction card 29-10, and all of the diffraction peaks are attributed to the crystal structure of $2Al_2O_3.B_2O_3$.

Incidentally, from the results obtained by melt-decomposing these aluminum borate whiskers by sodium pyrosulfate, forming aqueous solutions of these melts and performing the elementary determination and scanning electron microscope observation, it is confirmed that each of these aluminum borate whiskers is an aluminum borate whisker composed of a single phase.

The so-isolated aluminum borate whisker is a colorless transparent long needle-shaped crystal having a fiber diameter of 0.05 to 5 μm, especially 0.1 to 3 μm, a length of 2 to 100 μm, especially 2 to 50 μm, and an aspect ratio of 10 to 100, and the whisker has an excellent resistance to a hot mineral acid or a hot alkali. For example, even if the whisker is immersed in 2N hydrochloric acid at 90° C. for 2 days, the weight loss is not observed and no change is caused in the appearance. Furthermore, the whisker can hardly be dissolved in hot aqua regia, and only by the method using sodium pyrosulfate or sodium hydroxide, it is possible to decompose and dissolve the whisker of the present invention.

The aluminum borate whisker of the present invention is excellent in acid resistance, alkali resistance, chemical resistance, heat insulating property, heat resistance, neutron-absorbing capacity and electrical insulating property and is valuable as a heat-insulating material, a heat-resistant material and an anti-corrosive material and also as a reinforcer for thermoplastic resins, thermosetting resins, cements, ceramics and metals.

The present invention will now be described in detail with reference to the following examples that by no means limit the scope of the invention.

EXAMPLE 1

In a mortar, 10 g of aluminum sulfate $[Al_2(SO_4)_3]$, 2 g of orthoboric acid $(H_3BO_3)$ and 9 g of potassium chloride (KCl) were sufficiently pulverized and mixed, and the mixture was transferred into an alumina crucible and reacted at 1100° C. for 3 hours in an electric furnace. The reaction product was gradually cooled and boiled in 200 cc of 1N hydrochloric acid to remove the flux by dissolution, whereby a crude aluminum borate whisker was obtained. Then, a minute amount of a non-fibrous by-product was separated by decantation using water to obtain 1.7 g of an aluminum borate whisker. The so-obtained whisker has an incongruent melting point of 1440° C., and the $Al_2O_3/B_2O_3$ molar ratio determined by the quantitative analysis of aluminum and boron was 8.98/2.00.

The aluminum borate whisker obtained according to this process had a fiber diameter of 0.5 to 1 μm and a length of 5 to 20 μm, and the scanning electron microscope photograph of the whisker is shown in FIG. 1 and the powder X-ray diffraction data of the whisker are shown in Table 1 together with those of ASTM 32-3. Incidentally, in Table 1, a peak having a higher diffraction intensity than in ASTM 32-3 is indicated by a mark "+" and a peak having a lower diffraction intensity than in ASTM 32-3 is indicated by a mark "−". All of the indexes of the planes having a higher diffraction intensity are hko (h and k are not zero), and the diffraction intensities of other planes are substantially reduced and some peaks disappear. From these results, it is construed that the fiber axis is in parallel to the C axis.

Diffraction peaks other than those of $9Al_2O_3.2B_2O_3$ are not observed in the powder X-ray diffraction data. In view of this fact and the results of the elementary analysis, it is proved that a whisker of a single phase of $9Al_2O_3.2B_2O_3$ was obtained in the present example.

TABLE 1

| | Powder X-ray Diffraction Date Obtained in Example 1 | | | |
| --- | --- | --- | --- | --- |
| | Example 1 of Present Invention | | ASTM 32-3 | |
| Index hkl | d Å | Relative Intensity | d Å | Relative Intensity |
| 020 | — | — — | 7.52 | 1 |
| 120 | 5.368 | 100 + | 5.375 | 100 |
| 011 | — | — — | 5.301 | 18 |
| 111 | 4.359 | 1 — | 4.365 | 52 |

TABLE 1-continued

Powder X-ray Diffraction Date Obtained in Example 1

| Index hkl | Example 1 of Present Invention d Å | Relative Intensity | ASTM 32-3 d Å | Relative Intensity |
|---|---|---|---|---|
| 200 | 3.846 | 1 − | 3.846 | 8 |
| 040 031 | ) 3.748 | 1 − | 3.750 | 16 |
| 220 140 | 3.418 | 9 + | 3.419 | 14 |
| 131 | 3.368 | 19 + | 3.373 | 42 |
| 211 | — | — — | 3.111 | 2 |
| 002 | 2.828 | 1 − | 2.831 | 7 |
| 240 231 | ) 2.681 | 24 + | 2.685 | 41 |
| 022 | — | — — | 2.649 | 4 |
| 122 | 2.502 | 2 − | 2.505 | 25 |
| 320 | 2.421 | 2 + | 2.424 | 4 |
| 311 | — | — — | 2.307 | 5 |
| 202 | — | — — | 2.281 | 3 |
| 042 | 2.257 | 1 − | 2.260 | 14 |
| 222 | — | — — | 2.181 | 27 |
| 142 | 2.178 | 4 + | 2.169 | 10 |
| 340 331 | ) 2.113 | 9 + | 2.116 | 21 |

COMPARATIVE EXAMPLE 1

For comparison, an aluminum borate whisker was synthesized by the process of U.S. Pat. No. 3,080,242 not using a chloride, sulfate or carbonate of an alkali metal as the flux.

Namely, 8.7 g of aluminum oxide ($Al_2O_3$), 12.1 g of sodium tetraborate ($Na_2B_4O_7$) and 2.1 g of boron oxide ($B_2O_3$) were sufficiently pulverized and mixed in a mortar, and the mixture was transferred into a platinum crucible and reaction was carried out at 1400° C. for 1 hour in an electric furnace. The reaction product was gradually cooled and treated in the same manner as described in Example 1 to obtain 1.1 g of an aluminum borate whisker. The obtained whisker had a fiber diameter of about 10 μm and a length of 200 to 3000 μm. The $Al_2O_3/B_2O_3$ molar ratio determined by the quantitative analysis of aluminum and boron was 4.87/1.00.

EXAMPLE 2

In 100 cc of water were dissolved or dispersed 1.56 g of aluminum hydroxide [$Al(OH)_3$], 4.94 g of orthoboric acid ($H_3BO_3$) and 2.3 g of sodium chloride (NaCl) as the flux, and the obtained slurry was evaporated to dryness with stirring. The obtained solid was charged in an alumina crucible and reaction was carried out at 1200° C. for 2 hours in an electric furnace. The reaction product was treated in the same manner as described in Example 1 to obtain 0.5 g of an aluminum borate whisker ($9Al_2O_3.2B_2O_3$). The obtained whisker had a fiber diameter of about 0.1 μm and a length of 5 to 10 μm.

EXAMPLE 3

In a mortar, 28 g of aluminum nitrate nonahydrate [$Al(NO_3)_2.9H_2O$], 0.9 g of sodium tetraborate ($Na_2B_4O_7$) and 13 g of an equimolar mixture of sodium chloride (NaCl) and potassium chloride (KCl) as the flux were sufficiently pulverized and mixed, and the mixture was charged in an alumina crucible and reaction was carried out at 900° C. for 8 hours in an electric furnace. The reaction product was gradually cooled and boiled in 1000 cc of water to remove the flux by dissolution, whereby a crude aluminum borate whisker was obtained. A minute amount of a non-fibrous by-product was separated by decantation, and impurities were removed by dissolution in 1N hydrochloric acid to obtain 2.5 g of a pure aluminum borate whisker ($9Al_2O_3.2B_2O_3$). The whisker had a fiber diameter of about 1 to about 3 μm and a length of about 20 to about 30 μm.

EXAMPLE 4

In a mortar, 18 g of aluminum sulfate tetra-to-octadecahydrate [$Al_2(SO_4)_3.14-18H_2O$], 2.5 g of orthoboric acid ($H_3BO_3$) and 10 g of sodium carbonate ($Na_2CO_3$) were sufficiently pulverized and mixed, and the mixture was charged in a platinum crucible and reaction was carried out at 1200° C. for 1 hour in an electric furnace. The reaction product was treated in the same manner as described in Example 1 to obtain 2.5 g of an aluminum borate whisker ($9Al_2O_3.2B_2O_3$). The whisker had a fiber diameter of about 0.5 μm and a length of about 5 μm.

EXAMPLE 5

In a mortar, 17 g of potassium aluminum sulfate [$AlK(SO_4)_2$], 2 g of boron oxide ($B_2O_3$) and 20 g of sodium sulfate ($Na_2SO_4$) as the flux were sufficiently pulverized and mixed, and the mixture was transferred into an alumina crucible and reaction was carried out at 950° C. for 8 hours in an electric furnace. The reaction product was treated in the same manner as described in Example 1 to obtain 2.1 g of an aluminum borate whisker ($9Al_2O_3.2B_2O_3$). The whisker had a fiber diameter of about 1 μm and a length of 20 to 50 μm.

EXAMPLE 6

In a 5-liter porcelain pot mill, 610 g of alumina sulfate [$Al_2(SO_4)_3.13.4H_2O$], 55 g of orthoboric acid ($H_3BO_3$) and 418 g of potassium sulfate ($K_2SO_4$) were pulverized and mixed for about 2 hours by using alumina balls, and the mixture was charged in a 1-liter alumina crucible and reaction was carried out at 1100° C. for 4 hours in an electric furnace. The reaction product was boiled in 10 l of 1N hydrochloric acid to remove the flux by dissolution and obtain a crude aluminum borate whisker. The crude whisker was treated in the same manner as described in Example 1 to obtain 100 g of an aluminum borate whisker ($9Al_2O_3.2B_2O_3$). The whisker had a fiber diameter of 0.2 to 0.5 μm and a length of 5 to 20 μm.

EXAMPLE 7

In a 5-liter porcelain pot mill, 548 g of aluminum sulfate ($Al_2(SO_4)_3$), 58 g of sodium tetraborate pentahydrate ($Na_2B_4O_7.5H_2O$) and 6.97 g of potassium sulfate ($K_2SO_4$) were pulverized and mixed for about 2 hours by using alumina balls, and the mixture was charged in a 1-liter alumina crucible and reacted at 1100° C. for 4 hours in an electric furnace. The reaction product was gradually cooled and treated in the same manner as described in Example 6 to obtain 140 g of an aluminum borate whisker ($9Al_2O_3.2B_2O_3$). The whisker had a fiber diameter of 0.4 to 1.0 μm and a length of 10 to 30 μm.

EXAMPLE 8

In a mortar, 7 g of aluminum sulfate [$Al_2(SO_4)_3$], 3.7 g of orthoboric acid ($H_3BO_3$) and 7 g of potassium chloride (KCl) as the flux were sufficiently pulverized and mixed, and the mixture was transferred into an alumina crucible and reaction was carried out at 850° C. for 3 hours in an electric furnace. The reaction product was gradually cooled and treated in the same manner as described in Example 1 to obtain 1.0 g of an aluminum borate whisker. The so-obtained whisker had an incongruent melting point of 1050° C., and the $Al_2O_3/B_2O_3$ molar ratio determined by the quantitative analysis of aluminum and boron was 1.97/1.00.

The so-obtained aluminum borate whisker had a fiber diameter of 0.2 to 0.5 μm and a length of 2 to 15 μm. The scanning electron microscope photograph of the obtained whisker is shown in FIG. 2 and data of the powder X-ray diffraction of the whisker are shown in Table 2 together with those of ASTM 29-10. From the data shown in Table 2, it is seen that the intensities of [220], [231], [440] and [341] diffraction planes are increased, and it is construed that the fiber axis is in parallel or substantially in parallel to these planes.

In the powder X-ray diffraction data, diffraction peaks other than those of $2Al_2O_3.B_2O_3$ are not observed, and in view of this fact as well as the results of the elementary analysis, it is proved that a whisker of a single phase of $2Al_2O_3.B_2O_3$ was obtained in the present example.

TABLE 2

| Powder X-ray Diffraction Date Obtained in Example 8 | | | | |
|---|---|---|---|---|
| | Example 8 of Present Invention | | ASTM 32-3 | |
| Index hkl | d Å | Relative Intensity | d Å | Relative Intensity |
| 210 | 6.63 | 1 | 6.64 | <5 |
| 220 | 5.29 | 100 + | 5.30 | 100 |
| 300, 111 | 4.91 | 9 | 4.92 | 15 |
| 410, 311 | 3.57 | 4 | 3.58 | 7 |
| 231 | 3.34 | 26 + | 3.34 | 25 |
| 440, 341 | 2.643, 2.606 | 40 +, 10 + | 2.650 | 25 |
| 600 | 2.457 | 6 | 2.458 | 13 |
| 312 | 2.389 | 4 | 2.388 | <5 |
| 450, 351 | 2.353 | 3 | 2.351 | <5 |
| 142, 402 | 2.222 | 4 | 2.220 | 9 |
| 422 | 2.134 | 12 | 2.135 | 20 |
| 710 | 2.181 | 15 | 2.086 | 11 |

COMPARATIVE EXAMPLE 2

For comparison, an aluminum borate whisker was synthesized according to the process of U.S. Pat. No. 3,080,242 not using a chloride, sulfate or carbonate of an alkali metal as the flux.

Namely, 1 g of aluminum hydroxide [Al(OH)₃] and 4.0 g of boron oxide (B₂O₃) were sufficiently pulverized and mixed in a mortar, and the mixture was charged in a platinum crucible and reaction was carried out at 1400° C. for 30 minutes in an electric furnace. The reaction was gradually cooled and treated in the same manner as described in Example 1 to obtain 0.40 g of an aluminum borate whisker. The so-obtained whisker had a fiber diameter of about 10 μm and a length of 100 to 500 μm, and the Al₂O₃/B₂O₃ molar ratio determined by the quantitative analysis of aluminum and boron was 2.76/1.00.

EXAMPLE 9

In 100 cc of water were dissolved or dispersed 1.56 g of aluminum hydroxide [Al(OH)₃], 4.94 g of orthoboric acid (H₃BO₃) and 3.0 g of (Na₂SO₄), and the obtained slurry was evaporated to dryness with stirring. The solid was charged in an alumina crucible and reaction was carried out at 900° L C. for 8 hours in an electric furnace. The reaction product was treated in the same manner as described in Example 1 to obtain 0.4 g of an aluminum borate whisker (2Al₂O₃.B₂O₃). The obtained whisker had a fiber diameter of about 0.1 μm and a length of 5 to 10 μm.

EXAMPLE 10

In a mortar, 18.8 g of aluminum nitrate [Al(NO₃)₃.9-H₂O], 2.5 g of sodium tetraborate (Na₂B₄O₇) and 13 g of an equimolar mixture of sodium chloride (NaCl) and potassium chloride (KCl) as the flux were sufficiently pulverized and mixed, and reaction was carried out at 800° C. for 8 hours in an electric furnace. The reaction product was treated in the same manner as described in Example 1 to obtain 1.2 g of an aluminum borate whisker (2Al₂O₃.B₂O₃). The so-obtained whisker had a fiber diameter of about 0.5 μm and a length of about 5 μm.

EXAMPLE 11

In a mortar, 12 g of aluminum sulfate tetradeca-to-octadeca-hydrate [Al₂(SO₄)₃.14-18H₂O], 3.7 g of orthoboric acid and 5.3 g of sodium carbonate (Na₂CO₃) as the flux were sufficiently pulverized and mixed, and the mixture was charged in a platinum crucible and reaction was carried out at 1000° C. for 1 hour in an electric furnace. The reaction product was treated in the same manner as described in Example 1 to obtain 2.5 g of an aluminum borate whisker (2Al₂O₃.B₂O₃) having a fiber diameter of 1 to 3 μm and a length of 20 to 30 μm.

EXAMPLE 12

In a mortar, 12 g of potassium aluminum sulfate [AlK(SO₄)₂], 2.5 g of boron oxide (B₂O₃) and 10 g of sodium sulfate (Na₂SO₄) as the flux were sufficiently pulverized and mixed, and the mixture was charged in a platinum crucible and reaction was carried out at 900° C. for 4 hours in an electric furnace. The reaction product was treated in the same manner as described in Example 1 to obtain 1.5 g of an aluminum borate whisker (2Al₂O₃.B₂O₃). The whisker had a fiber diameter of about 1 μm and a length of 20 to 50 μm.

EXAMPLE 13

In a 5-liter porcelain pot mill, 507 g of aluminum hydroxide [Al(OH)₃], 328 g of sodium tetraborate (Na₂B₄O₇) and 185 g of sodium sulfate (Na₂SO₄) were pulverized and mixed for about 2 hours by using alumina balls. The mixture was charged in a 1-liter alumina crucible and reaction was carried out at 1100° C. for 4 hours in an electric furnace, and the reaction was treated in the same manner as described in Example 6 to obtain 150 g of an aluminum borate whisker (9Al₂O₃.2B₂O₃). The obtained whisker had a fiber diameter of 0.2 to 0.5 μm and a length of 2 to 10 μm.

We claim:

1. A process for the preparation of an aluminum borate whisker having a composition represented by the formula 9Al₂O₃.2B₂O₃, a fiber diameter of 0.05 to 5 μm, a fiber length of 2 to 50 μm and an aspect ratio of 10 to 100, which comprises reacting (i) at least one aluminum-supplying component selected from the group consisting of aluminum hydroxides and inorganic salts of aluminum and (ii) at least one boric acid-supplying component selected from the group consisting of boron oxides, boron oxyacids and alkali metal salts of boron oxyacids, in the presence of at least one flux selected from the group consisting of sodium chloride, potassium chloride, alkali metal sulfates and alkali metal carbonates at a temperature of 1000° to 1200° C. for at least 30 minutes to effect growing of the whisker, wherein the aluminum-supplying component is mixed with the boric acid-supplying component so that the aluminum/boron molar ratio is from 1/4 to 9/1, and the flux is added in an amount of 10 to 95% by weight based on the total mixture.

2. A process according to claim 1, wherein aluminum sulfate is used as the aluminum-supplying component, at least one member selected from the group consisting of boric acid, sodium tetraborate and potassium tetraborate is used as the boric acid-supplying component, at least one member selected from the group consisting of potassium sulfate and potassium chloride is used as the flux, the aluminum-supplying component and the boric acid-supplying component are mixed so that the aluminum/boron molar ratio is from 5/5 to 8/2, and the flux is added in an amount of 30 to 80% by weight based on the total mixture.

3. A process according to claim 1, wherein aluminum hydroxide is used as the aluminum-supplying component, at least one member selected from the group consisting of sodium tetraborate and potassium tetraborate is used as the boric acid-supplying component, at least one member selected from the group consisting of sodium chloride and sodium sulfate is used as the flux, the aluminum-supplying component and the boric acid-supplying component are mixed so that the aluminum/boron molar ratio is from 4/6 to 6/4, and the flux is added in an amount of 10 to 80% by weight based on the total mixture.

4. A process for the preparation of an aluminum borate whisker having a composition represented by the formula of $2Al_2O_3 \cdot B_2O_3$, a fiber diameter of 0.05 to 5 μm, a fiber length of 2 to 50 μm and an aspect ratio of 10 to 100 which comprises reacting (i) at least one aluminum-supplying component selected from the group consisting of aluminum hydroxides and inorganic salts of aluminum and (ii) at least one boric acid-supplying component selected from the group consisting of boron oxides, boron oxyacids and alkali metal salts of boron oxyacids, in the presence of at least one flux selected from the group consisting of sodium chloride, potassium chloride, alkali metal sulfates and alkali metal carbonates at a temperature of 600° to 1000° C. for at least 30 minutes to effect growing of the whisker, wherein the aluminum-supplying component and the boric acid-supplying component are mixed so that the aluminum/boron molar ratio is from 1/9 to 6/4 and the flux is added in an amount of 10 to 95% by weight based on the total mixture.

5. A process according to claim 4, wherein aluminum sulfate is used as the aluminum-supplying component, at least one member selected from the group consisting of boric acid, sodium tetraborate and potassium tetraborate is used as the boric acid-supplying component, at least one member selected from the group consisting of potassium sulfate and potassium chloride is used as the flux, the aluminum-supplying component and the boric acid-supplying component are mixed so that the aluminum/boron molar ratio is from 3/7 to 5/5, and the flux is added in an amount of 30 to 80% by weight.

* * * * *